(12) United States Patent
Chuang et al.

(10) Patent No.: US 9,395,616 B2
(45) Date of Patent: Jul. 19, 2016

(54) PROJECTION SCREEN AND MANUFACTURING METHOD OF PROJECTION SCREEN

(71) Applicants: Fu-Ming Chuang, Hsin-Chu (TW); Hung-Ta Chien, Hsin-Chu (TW); Fang-Hsuan Su, Hsin-Chu (TW)

(72) Inventors: Fu-Ming Chuang, Hsin-Chu (TW); Hung-Ta Chien, Hsin-Chu (TW); Fang-Hsuan Su, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 14/526,534

(22) Filed: Oct. 29, 2014

(65) Prior Publication Data
US 2015/0362832 A1 Dec. 17, 2015

(30) Foreign Application Priority Data
Jun. 16, 2014 (TW) .............................. 103120717 A

(51) Int. Cl.
*G03B 21/602* (2014.01)
*G03F 7/00* (2006.01)
(Continued)

(52) U.S. Cl.
CPC ............... *G03B 21/602* (2013.01); *G02B 5/09* (2013.01); *G03F 7/0005* (2013.01); *G02B 3/0006* (2013.01); *G02B 3/08* (2013.01); *G02B 5/003* (2013.01); *G02B 5/0284* (2013.01)

(58) Field of Classification Search
CPC .... G03B 21/60; G03B 21/602; G03B 21/605; G02B 3/08; G02B 5/09
USPC .......................................... 359/449, 459, 457
See application file for complete search history.

(56) References Cited

U.S. PATENT DOCUMENTS

| | | | | |
|---|---|---|---|---|
| 3,893,748 | A | * | 7/1975 | De Palma .............. G03B 21/60 359/455 |
| 4,206,969 | A | * | 6/1980 | Cobb ................... G03B 21/602 359/452 |

(Continued)

FOREIGN PATENT DOCUMENTS

| | | |
|---|---|---|
| CN | 102023471 | 4/2011 |
| CN | 102243430 | 11/2011 |

(Continued)

OTHER PUBLICATIONS

"Office Action of Taiwan Counterpart Application", issued on Feb. 6, 2015, p. 1-p. 10.

(Continued)

*Primary Examiner* — Christopher Mahoney
(74) *Attorney, Agent, or Firm* — Jianq Chyun IP Office

(57) ABSTRACT

A projection screen that includes a transparent substrate, a plurality of micro-lens structures, a Fresnel lens structure, a light absorption layer, and a diffusive reflection layer is provided. The transparent substrate has a first surface and a second surface opposite to the first surface. The micro-lens structures are located at the first surface of the transparent substrate. The Fresnel lens structure is located at the second surface of the transparent substrate. The light absorption layer includes a light absorption portion. The diffusive reflection layer includes a plurality of dispersive diffusive reflection portions connected to the Fresnel lens structure. The deviation degrees of the diffusive reflection portions with respect to a plurality of optical axes of the corresponding micro-lens structures increase together with an increase in slopes of inclined surfaces of the Fresnel lens structure on the corresponding optical axes. A manufacturing method of the projection screen is also provided.

21 Claims, 14 Drawing Sheets

(51) Int. Cl.
*G02B 5/09* (2006.01)
*G02B 5/02* (2006.01)
*G02B 5/00* (2006.01)
*G02B 3/00* (2006.01)
*G02B 3/08* (2006.01)

(56) References Cited

U.S. PATENT DOCUMENTS

| | | | | |
|---|---|---|---|---|
| 5,096,278 A * | 3/1992 | Yoshioka | ............ | G03B 21/602 359/459 |
| 6,023,369 A * | 2/2000 | Goto | .................... | G03B 21/602 359/443 |
| 7,859,750 B2 * | 12/2010 | Akiyama | ............ | G03B 21/602 359/454 |
| 8,780,444 B2 * | 7/2014 | Arakawa | ................ | G03B 21/60 359/449 |
| 2005/0057804 A1 | 3/2005 | Umeya et al. | | |
| 2014/0036359 A1 * | 2/2014 | Jeon | ...................... | G03B 21/60 359/459 |

FOREIGN PATENT DOCUMENTS

| | | |
|---|---|---|
| EP | 0311189 | 4/1989 |
| JP | H03156435 | 7/1991 |
| JP | 3341225 | 11/2002 |
| JP | 2005351952 | 12/2005 |
| JP | 2009192875 | 8/2009 |
| JP | 2009210853 | 9/2009 |
| JP | 2013068721 | 4/2013 |
| TW | I378314 | 12/2012 |

OTHER PUBLICATIONS

"Office Action of Japan Counterpart Application", issued on Oct. 13, 2015, p. 1-p. 4.

* cited by examiner

PROJECTION SCREEN AND MANUFACTURING METHOD OF PROJECTION SCREEN

CROSS-REFERENCE TO RELATED APPLICATION

This application claims the priority benefit of Taiwan application serial no. 103120717, filed on Jun. 16, 2014. The entirety of the above-mentioned patent application is hereby incorporated by reference herein and made a part of this specification.

BACKGROUND

1. Field of the Disclosure

The invention relates to an optical device and a manufacturing method thereof; more particularly, the invention relates to a projection screen and a manufacturing method thereof.

2. Description of Related Art

Micro-structures including inclined refraction/reflection surfaces for changing directions of beams, a micro-lens array for converging beams, a diffusive structure for scattering projection beams, and a light absorption structure for absorbing ambient beams may be configured on a projection screen.

However, the difficulty in aligning front and rear surfaces of the projection screen significantly complicates the manufacturing process of projection screen. In addition, conventional light absorption layers excessively absorb the projection beams, such that energy utilization efficiency is unavoidably reduced. Said issue of the utilization efficiency of the projection beams still need to be improved.

According to the disclosure of Europe patent publication no. 0311189A1, a Fresnel lens structure constituted by light incident surfaces and edges is formed on the front surface of a projection screen, wherein each of the light incident surface has micro-lenses for scattering the incident beam into beams, and each of the edges serves to absorb beams. China patent publication no. 102023471A discloses a reflective micro-lens array in which parts of beams emitting from a projector are absorbed by a light absorption layer. Taiwan Patent no. 1378314 discloses a plurality of light mixing chambers and a plurality of lens structures. U.S. patent publication no. 20050057804A1 discloses a projection screen.

SUMMARY OF THE INVENTION

The invention is directed to a projection screen capable of enhancing image contrast and increasing brightness gain.

The invention is also directed to a manufacturing method of a projection screen, so as to manufacture a projection screen capable of enhancing image contrast and increasing brightness gain.

Additional aspects and/or advantages of the invention will be set forth in part in the description which follows and, in part, will be obvious from the description, or may be learned by practice of the invention.

To achieve one, a part, or all of the objectives aforementioned or other objectives, one embodiment of the invention provides a projection screen including a transparent substrate, a plurality of micro-lens structures, a Fresnel lens structure, a light absorption layer, and a diffusive reflection layer. The transparent substrate has a first surface and a second surface opposite to the first surface. The micro-lens structures are located at the first surface of the transparent substrate. The Fresnel lens structure is located at the second surface of the transparent substrate. The light absorption layer includes a light absorption portion that is connected to the Fresnel lens structure. The diffusive reflection layer includes a plurality of dispersive diffusive reflection portions connected to the Fresnel lens structure, and the diffusive reflection portions respectively correspond to the micro-lens structures. Here, deviation degrees of the diffusive reflection portions with respect to a plurality of optical axes of the corresponding micro-lens structures increase together with an increase in slopes of inclined surfaces of the Fresnel lens structure on the corresponding optical axes.

According to an embodiment of the invention, a region of the light absorption portion directly connected to the Fresnel lens structure is other than a region of the diffusive reflection portions directly connected to the Fresnel lens structure.

According to an embodiment of the invention, the Fresnel lens structure includes a plurality of inclined surfaces having a substantially identical width in a direction perpendicular to the optical axes but having substantially different heights in a direction parallel to the optical axes.

According to an embodiment of the invention, the Fresnel lens structure includes a plurality of inclined surfaces having a substantially identical width in a direction perpendicular to the optical axes but having substantially different heights in a direction parallel to the optical axes.

According to an embodiment of the invention, the light absorption layer further includes a bottom portion connected to the light absorption portion. The diffusive reflection portions are located between the Fresnel lens structure and the bottom portion, and the light absorption portion is also located between the Fresnel lens structure and the bottom portion.

According to an embodiment of the invention, the diffusive reflection layer further includes a bottom portion connected to the diffusive reflection portions, the light absorption portion is located between the Fresnel lens structure and the bottom portion, and the diffusive reflection portions are located between the Fresnel lens structure and the bottom portion.

According to an embodiment of the invention, the micro-lens structures are randomly distributed on the first surface.

To achieve one of, a part of or all of the above-mentioned objectives, or to achieve other objectives, an embodiment of the invention provides a manufacturing method of a projection screen. The manufacturing method includes: providing a transparent substrate having a first surface and a second surface opposite to the first surface; forming a plurality of micro-lens structures on the first surface; forming a Fresnel lens structure on the second surface; forming a light absorption layer on the Fresnel lens structure, wherein the light absorption layer includes a light absorption portion; forming a diffusive reflection layer on the Fresnel lens structure, wherein the diffusive reflection layer includes a plurality of dispersive diffusive reflection portions respectively corresponding to the micro-lens structures, and deviation degrees of the diffusive reflection portions with respect to a plurality of optical axes of the corresponding micro-lens structures increase together with an increase in slopes of inclined surfaces of the Fresnel lens structure on the corresponding optical axes.

According to an embodiment of the invention, the step of forming the diffusive reflection portions includes: forming a negative photosensitive material layer on the Fresnel lens structure; providing a beam irradiating the negative photosensitive material layer after the beam sequentially passes through the first surface and the second surface; performing a development treatment on the negative photosensitive material layer, so as to remove a portion of the negative photosensitive material layer not irradiated by the beam, wherein non-removed portions of the negative photosensitive material layer constitute the diffusive reflection portions.

According to an embodiment of the invention, the step of forming the light absorption portion includes forming the light absorption layer on the Fresnel lens structure, wherein the light absorption layer covers the diffusive reflection portions, and a portion of the light absorption layer directly connected to the Fresnel lens structure constitutes the light absorption portion.

According to an embodiment of the invention, the step of forming the light absorption portion includes: coating the Fresnel lens structure with a positive photosensitive material layer; providing a beam irradiating the positive photosensitive material layer after the beam sequentially passes through the first surface and the second surface; performing a development treatment on the positive photosensitive material layer, so as to remove a portion of the positive photosensitive material layer irradiated by the beam, wherein non-removed portions of the positive photosensitive material layer constitute the light absorption portion.

According to an embodiment of the invention, the step of forming the diffusive reflection portions includes: forming the diffusive reflection layer on the Fresnel lens structure, wherein the diffusive reflection layer covers the light absorption portion, and a portion of the diffusive reflection layer directly connected to the Fresnel lens structure constitutes the diffusive reflection portions.

According to an embodiment of the invention, the step of forming the micro-lens structures on the first surface includes forming the micro-lens structures on the first surface, and the micro-lens structures are randomly distributed on the first surface.

According to an embodiment of the invention, the Fresnel lens structure is a one-dimensional or two-dimensional structure.

According to an embodiment of the invention, the micro-lens structures are one-dimensional lenticular micro-lens array or two-dimensional micro-lens array.

According to an embodiment of the invention, the micro-lens structures satisfy $T/2 \leq f \leq 10T$, wherein f is a focal length of each of the micro-lens structures, and T is a distance from a bottom of the micro-lens structures to a bottom of the Fresnel lens structure in a direction parallel to the optical axes.

According to an embodiment of the invention, the step of forming at least one of the light absorption portion and each of the diffusive reflection portions includes forming a material on the Fresnel lens structure by performing a dipping step, a spraying step, a jet printing step, a roller coating step, or a blade coating step.

According to an embodiment of the invention, the step of forming at least one of the Fresnel lens structure and each of the micro-lens structures includes performing a hot embossing step or an ultraviolet transfer printing step.

In view of the above, the projection screen and the manufacturing method of the projection screen described in the embodiments of the invention may have at least one of the following advantages. In the projection screen provided in an embodiment of the invention and according to the manufacturing method of the projection screen, the deviation degrees of the diffusive reflection portions with respect to the optical axes of the corresponding micro-lens structures increase together with an increase in slopes of inclined surfaces of the Fresnel lens structure on the corresponding optical axes, and the light absorption portion is connected to the Fresnel lens structure. Therefore, the diffusive reflection portions may effectively reflect the beams from the projection apparatus to the eyes of a user in a diffusive manner, and the light absorption portion can absorb the ambient beams. Thus, the image contrast may be enhanced through the micro-lens structures, the diffusive reflection portions, and the light absorption portion of the projection screen; moreover, the beams emitted from the projection apparatus can be guided to the eyes of the user through the Fresnel lens structure, so as to increase the brightness gain.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the invention could be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
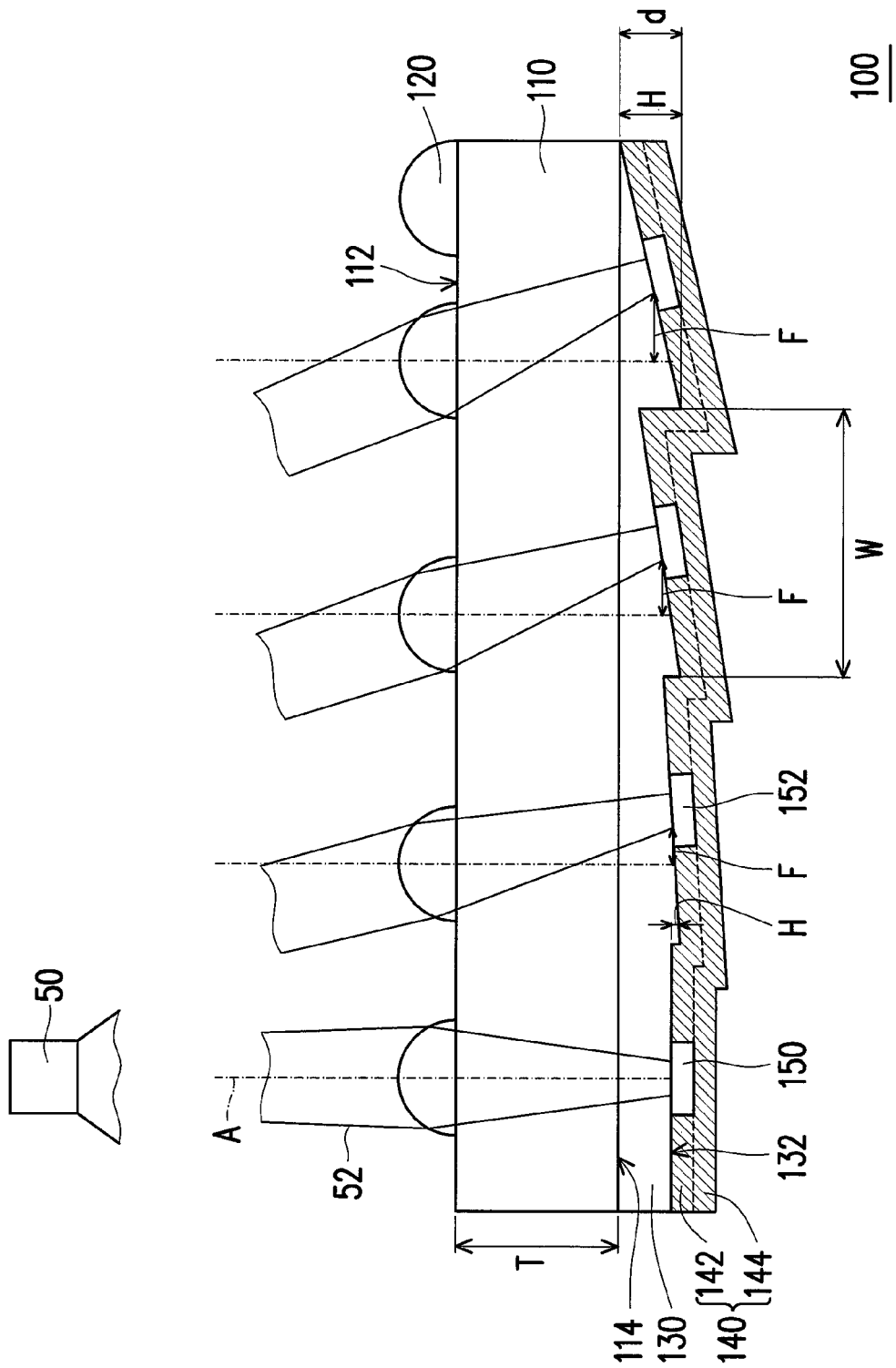
FIG. 1A is a schematic cross-sectional view illustrating a projection screen according to an embodiment of the invention.
Figure 1B:
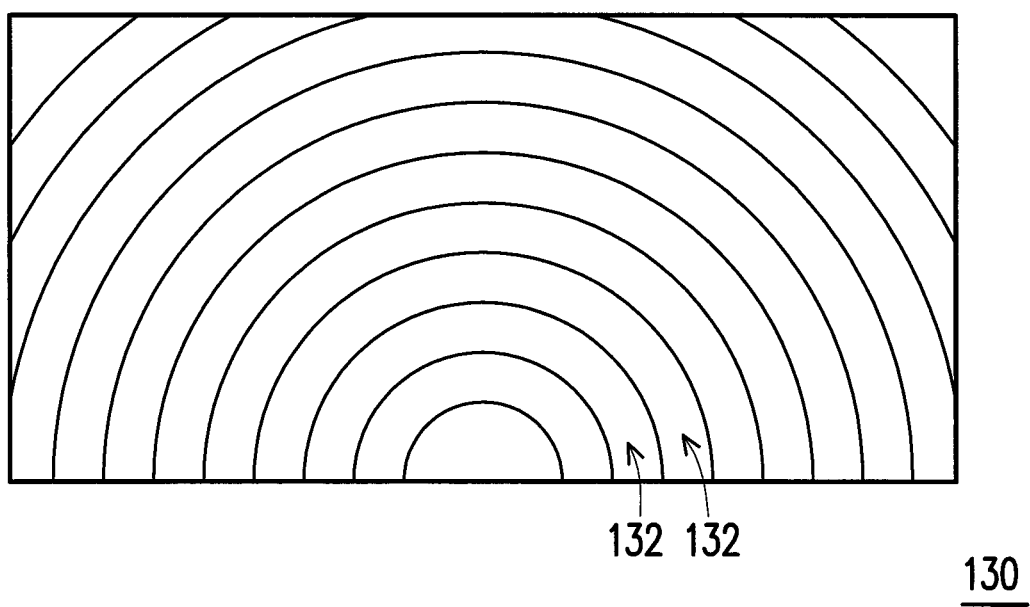
FIG. 1B is a front view illustrating a Fresnel lens structure in the projection screen depicted in FIG. 1A.

FIG. 1A is a schematic cross-sectional view illustrating a projection screen according to an embodiment of the invention. FIG. 1B is a front view illustrating a Fresnel lens structure in the projection screen depicted in FIG. 1A. With reference to FIG. 1A and FIG. 1B, a projection screen 100 described in the embodiment includes a transparent substrate 110, a plurality of micro-lens structures 120, a Fresnel lens structure 130, a light absorption layer 140, and a diffusive reflection layer 150. The transparent substrate 110 has a first surface 112 and a second surface 114 opposite to the first surface 112. According to the embodiment, the transparent substrate 110 is a plastic substrate made of polyethylene terephthalate (PET), for instance, and the micro-lens structures 120 are located at the first surface 112 of the transparent substrate 110. The micro-lens structures 120 are randomly distributed on the first surface 112.

The Fresnel lens structure 130 is located at the second surface 114 of the transparent substrate 110. The Fresnel lens structure 130 is a two-dimensional structure as shown in FIG. 1B, that is, the inclined surface of the Fresnel lens structure 130 is in form of plural arcs with the same curvature center. According to the embodiment, the transparent substrate 110 may be coated with an ultraviolet curing adhesive to perform a shaping process (e.g., a stamping process), then the ultraviolet curing adhesive may be irradiated by ultraviolet beams to be cured, such that the micro-lens structures 120 and the Fresnel lens structure 130 are formed. However, in another embodiment, the micro-lens structures 120 and the Fresnel lens structure 130 may be formed by heating the transparent substrate 110 to a glass transition temperature and then performing a hot pressing process, the invention is not limited thereto.

The light absorption layer 140 includes a light absorption portion 142 that is connected to the Fresnel lens structure 130. In the embodiment, the light absorption layer 140 is made of a black material or a black glue, for instance. The diffusive reflection layer 150 includes a plurality of dispersive diffusive reflection portions 152 connected to the Fresnel lens structure 130, and the diffusive reflection portions 152 respectively correspond to the micro-lens structures 120. The diffusive reflection portions 152 are made of photosensitive materials, e.g., white negative photosensitive materials.

The deviation degrees of the diffusive reflection portions 152 with respect to a plurality of optical axes A of the corresponding micro-lens structures 120 (e.g., the deviation distance F in a direction parallel to the first surface 112) increase together with an increase in slopes of inclined surfaces 132 of the Fresnel lens structure 130 on the corresponding optical axes A. Specifically, if an image beam 52 irradiates the projection screen 100 by the projection apparatus 50, the larger the incident angle at which the image beam 52 enters the projection screen 100, the greater the slopes of the inclined surfaces 132 of the Fresnel lens structure 130. Thereby, the focus of the image beam 52 (collected by the micro-lens structures 120) deviates from the optical axes A of the micro-lens structures 120 to a greater extent. Besides, the diffusive reflection portions 152 are located around the focus. In another aspect, a region of the light absorption portion 142 directly connected to (i.e., in direct contact with) the Fresnel lens structure 130 is other than a region of the diffusive reflection portions 152 directly connected to (i.e., in direct contact with) the Fresnel lens structure 130.

Thereby, when the image beam 52 emitting from the projection apparatus 50 enters the projection screen 100, the image beam 52 is converged onto the diffusive reflection portions 152 by the micro-lens structures 120 and the diffusive reflection portions 152 reflect the image beam 52 in a diffusive manner, such that the image beam 52 passes through the second surface 114 and the first surface 112 sequentially and is then transmitted to the eyes of the user. It can thus be derived from the above that the Fresnel lens structure 130 is conducive to guiding the image beam 52 to the front direction (i.e., the direction toward the user) of the projection screen 100, so as to prevent the image beam 52 from being projected toward places where no users are located. In addition, when the ambient beam enters into the projection screen 100, and when the incident angle of the ambient beam is different from the image beam 52, the ambient beam is converged into a region where the light absorption portion 142 is located (i.e., a region other than where the diffusive reflection portions 152 of the Fresnel lens structure 130 are located). Hence, the ambient beam is absorbed by the light absorption portion 142 and is less likely to be transmitted to the eyes of the user. Since fewer ambient beams are transmitted to the eyes of the user, the contrast of the image projected to the projection screen 100 can be increased through the configuration of the micro-lens structures 120, the light absorption portion 142, and the diffusive reflection portions 152. Besides, the diffusive reflection portions 152 are located at a region capable of diffusing the image beam 52, the brightness gain of the image projected onto the projection screen 100 can be effectively increased because of the configuration of the Fresnel lens structure 130. As a result, the projection screen 100 characterized by said advantages can be applied in an outdoor environment or in an indoor environment with sufficient lighting according to the embodiment.

The light absorption portion 142 is disposed on the projection screen 100 described in the embodiment, if the incident angle of the ambient beam is not limited, compared with the brightness of the ambient beam reflected by the projection screen having the Fresnel lens structure entirely coated with the diffusive reflection material, the brightness of the ambient beam of the projection screen 100 is (the area occupied by the diffusive reflection portions 152/(the total area occupied by the diffusive reflection portions 152 and the area occupied by the light absorption portion 142))×100%. Note that the ratio of the brightness of the ambient beam is less than 100% and decreases in response to an increase in the area occupied by the light absorption portion 142. Accordingly, the smaller the area occupied by the diffusive reflection portions 152, the less the interference of the ambient beam in the projected image; on the contrary, the larger the area occupied by the diffusive reflection portions 152, the greater the interference of the ambient beam in the projected image. Therefore, the projection screen 100 described in the embodiment can indeed reduce the interference of the ambient beam in the projected image effectively.

Besides, the ratio of the area of the first surface 112 occupied by the micro-lens structures 120 preferably approaches 100%, so as to improve the light utilization efficiency. Moreover, the pitch of the micro-lens structures 120, the pitch of the inclined surfaces 132 of the Fresnel lens structure 130, and the pixel size of the projected image preferably do not have similar values, so as to effectively prevent the moiré effect.

According to the embodiment, the light absorption layer 140 further includes a bottom portion 144 connected to the light absorption portion 142. The diffusive reflection portions 152 are located between the Fresnel lens structure 130 and the bottom portion 144, and the light absorption portion 142 is also located between the Fresnel lens structure 130 and the bottom portion 144.

The Fresnel lens structure 130 described herein includes a plurality of inclined surfaces 132 having a substantially identical width (e.g., the width W) in a direction perpendicular to the optical axes A but having substantially different heights (e.g., the height H) in a direction parallel to the optical axes A.

According to the embodiment, the micro-lens structures 120 satisfy T/2≤f≤10T. Here, f is a focal length of each of the micro-lens structures 120, and T is a distance from a bottom of the micro-lens structures 120 to a bottom of the Fresnel lens structure 130 in a direction parallel to the optical axes A, i.e., the thickness of the transparent substrate 110. Additionally, d is a thickness of the Fresnel lens structure 130. Thereby, the diffusive reflection portions 152 can be constantly located around the focus of the image beam 52.

Figure 2:
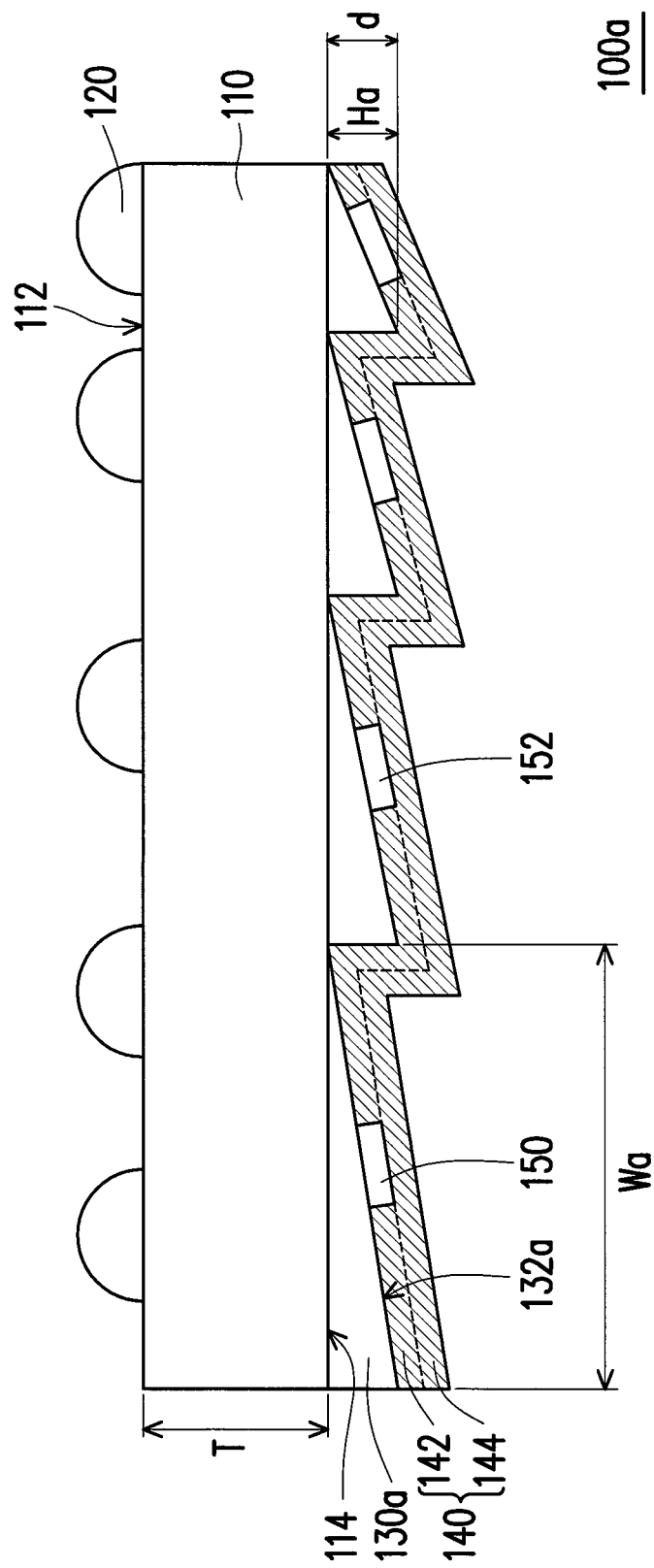
FIG. 2 is a schematic cross-sectional view illustrating a projection screen according to another embodiment of the invention.

FIG. 2 is a schematic cross-sectional view illustrating a projection screen according to another embodiment of the invention. With reference to FIG. 2, the projection screen 100a provided in the embodiment is similar to the projection screen 100 depicted in FIG. 1A, and the difference between these two projection screens 100a and 100 is described below. In the projection screen 100a, the Fresnel lens structure 130a described herein includes the inclined surfaces 132a having a substantially identical height (e.g., the height Ha) in a direction parallel to the optical axes A but having substantially different widths (e.g., the width Wa) in a direction perpendicular to the optical axes A. In another embodiment, however, the inclined surfaces 132a may have substantially different heights in the direction parallel to the optical axes A and have substantially different widths in the direction perpendicular to the optical axes A.

Figure 3:
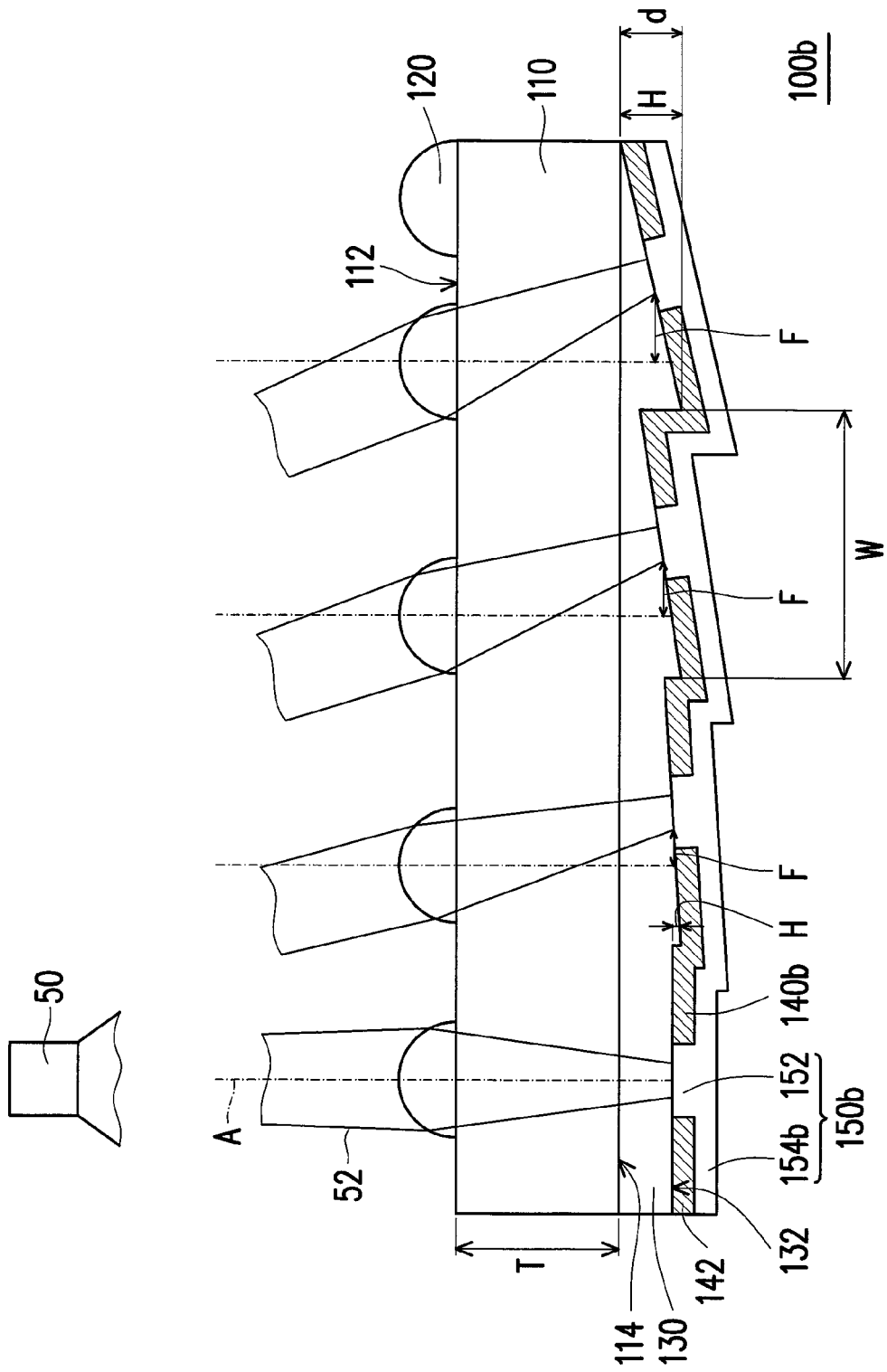
FIG. 3 is a schematic cross-sectional view illustrating a projection screen according to another embodiment of the invention.

FIG. 3 is a schematic cross-sectional view illustrating a projection screen according to another embodiment of the invention. With reference to FIG. 3, the projection screen 100b provided in the embodiment is similar to the projection screen 100 depicted in FIG. 1A, and the difference between these two projection screens 100b and 100 is described below. In the projection screen 100b, the diffusive reflection layer 150b further includes a bottom portion 154b connected to the diffusive reflection portions 152, the light absorption portion 142 is located between the Fresnel lens structure 130 and the bottom portion 154b, and the diffusive reflection portions 152 are located between the Fresnel lens structure 130 and the bottom portion 154b. Besides, the light absorption layer 140b includes the light absorption portion 142 but does not include the bottom portion 144 depicted in FIG. 1A. In the embodiment, the light absorption layer 140b is made of a photosensitive material, e.g., a black positive photosensitive material, and the diffusive reflection layer 150b is a white coating layer or a white glue, for instance.

Figure 4:
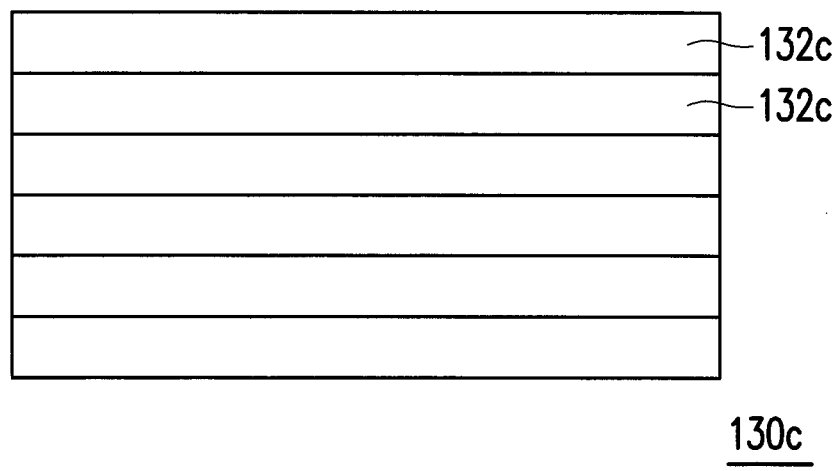
FIG. 4 is a schematic cross-sectional view illustrating a projection screen according to another embodiment of the invention.

FIG. 4 is a schematic cross-sectional view illustrating a projection screen according to another embodiment of the invention. With reference to FIG. 4, the Fresnel lens structure 130c described in the embodiment is similar to the Fresnel lens structure 130 depicted in FIG. 1B, while the difference therebetween lies in that the Fresnel lens structure 130c provided herein is a one-dimensional Fresnel lens structure, i.e., the inclined surfaces 132c of the Fresnel lens structure 130c are extended in form of bars along one direction (e.g., the horizontal direction depicted in FIG. 4) and are arranged along another direction (e.g., the vertical direction shown in FIG. 4), wherein the two direction can be substantially perpendicular to each other.

Figure 5A:
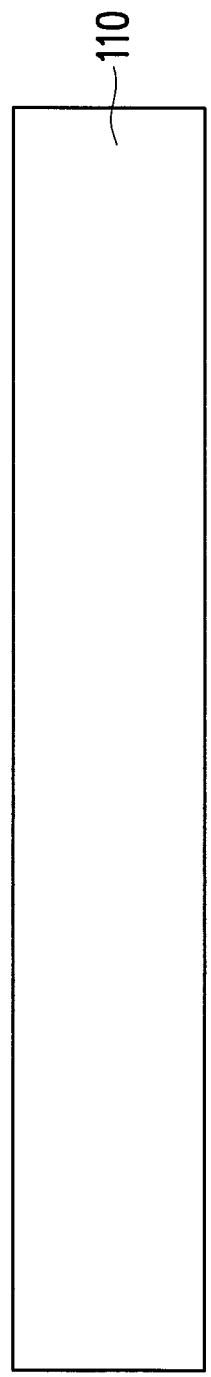
FIG. 5A to FIG. 5E are schematic cross-sectional views illustrating a manufacturing process of a projection screen according to an embodiment of the invention.
Figure 5B:
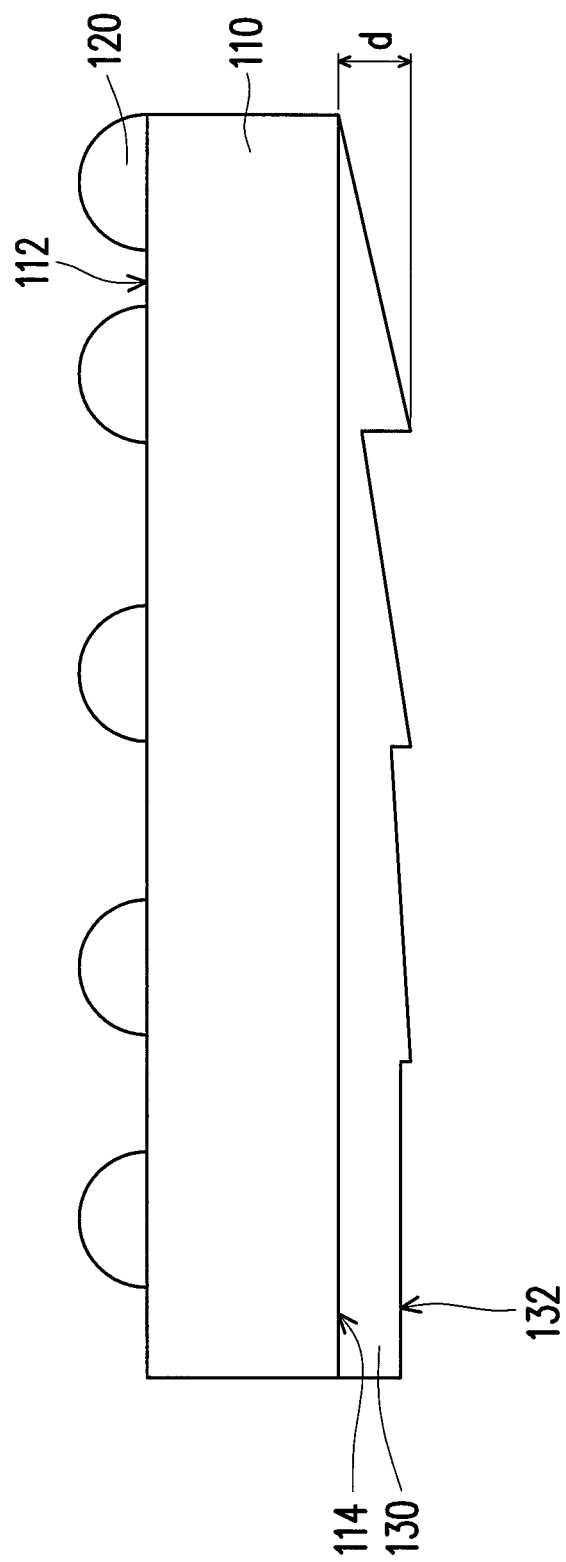

FIG. 5A to FIG. 5E are schematic cross-sectional views illustrating a manufacturing process of a projection screen according to an embodiment of the invention. With reference to FIG. 5A to FIG. 5E, the manufacturing method of the projection screen described in the embodiment may be applied to manufacture the projection screen 100 depicted in FIG. 1A and may include following steps. With reference to FIG. 5A, a transparent substrate 110 is provided. With reference to FIG. 5B, the micro-lens structures 120 depicted in FIG. 1A are formed on the first surface 112 of the transparent substrate 110, and the micro-lens structures 120 on the first surface 112 are randomly distributed, for instance. The Fresnel lens structure 130 is formed on the second surface 114 of the transparent substrate 110. In the embodiment, the Fresnel lens structure 130 is the two-dimensional Fresnel lens structure depicted in FIG. 1B, for instance. However, in another embodiment, the Fresnel lens structure 130 may be the one-dimensional Fresnel lens structure depicted in FIG. 4.

According to the embodiment, a method of forming the micro-lens structures 120 and the Fresnel lens structure 130 may include coating the transparent substrate 110 with an ultraviolet curing adhesive to perform a shaping process (e.g., a mold-stamping process), then the ultraviolet curing adhesive may be irradiated by ultraviolet beams to be cured, such that the micro-lens structures 120 and the Fresnel lens structure 130 are formed. However, in another embodiment, the micro-lens structures 120 and the Fresnel lens structure 130 may be formed by heating the transparent substrate 110 to a glass transition temperature and then performing a hot pressing process. Moreover, the order of forming the micro-lens structures 120 and the Fresnel lens structure 130 is not limited in the embodiment, i.e., whichever may be formed first or both may be formed at the same time.

Figure 5C:
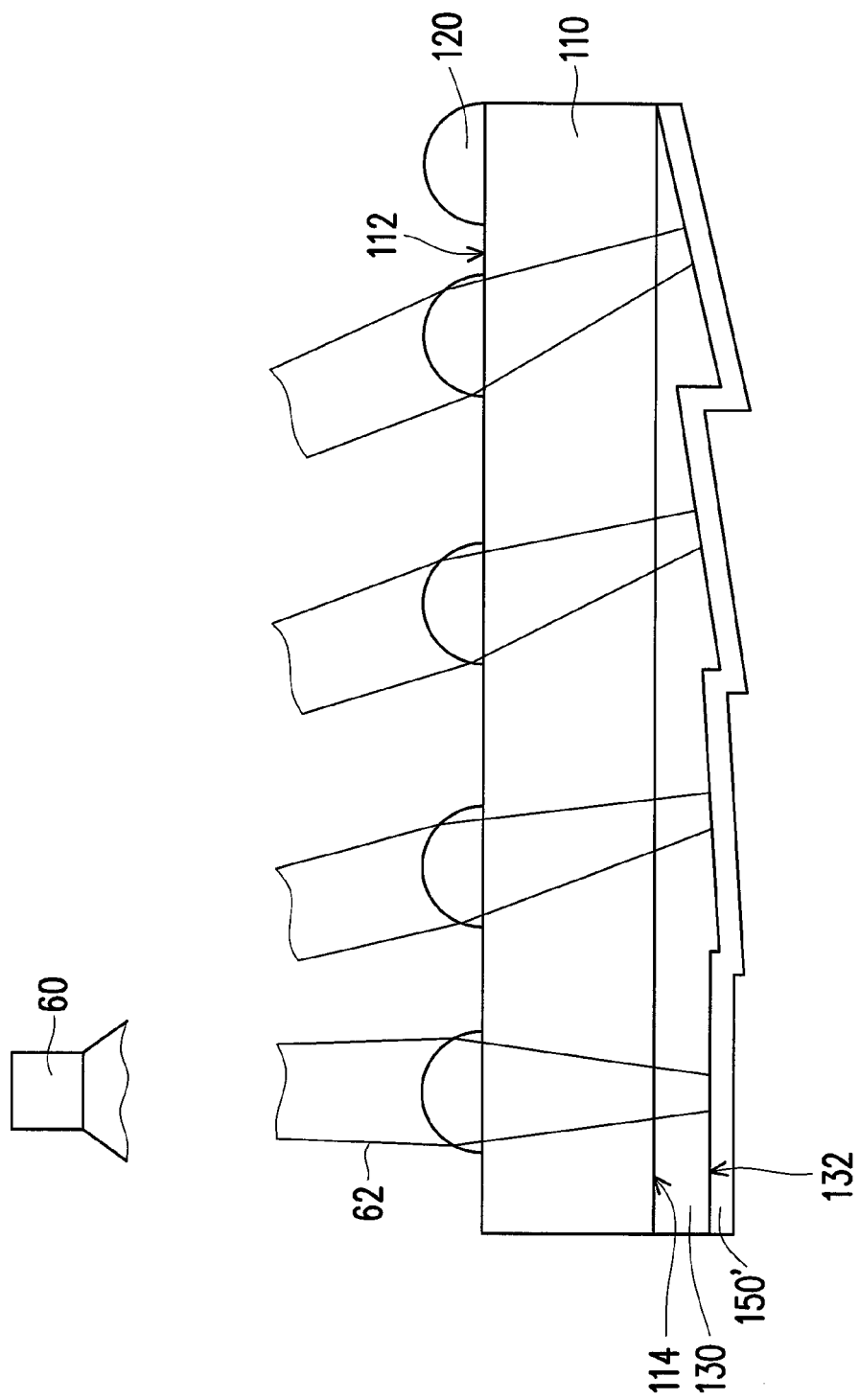
Figure 5D:
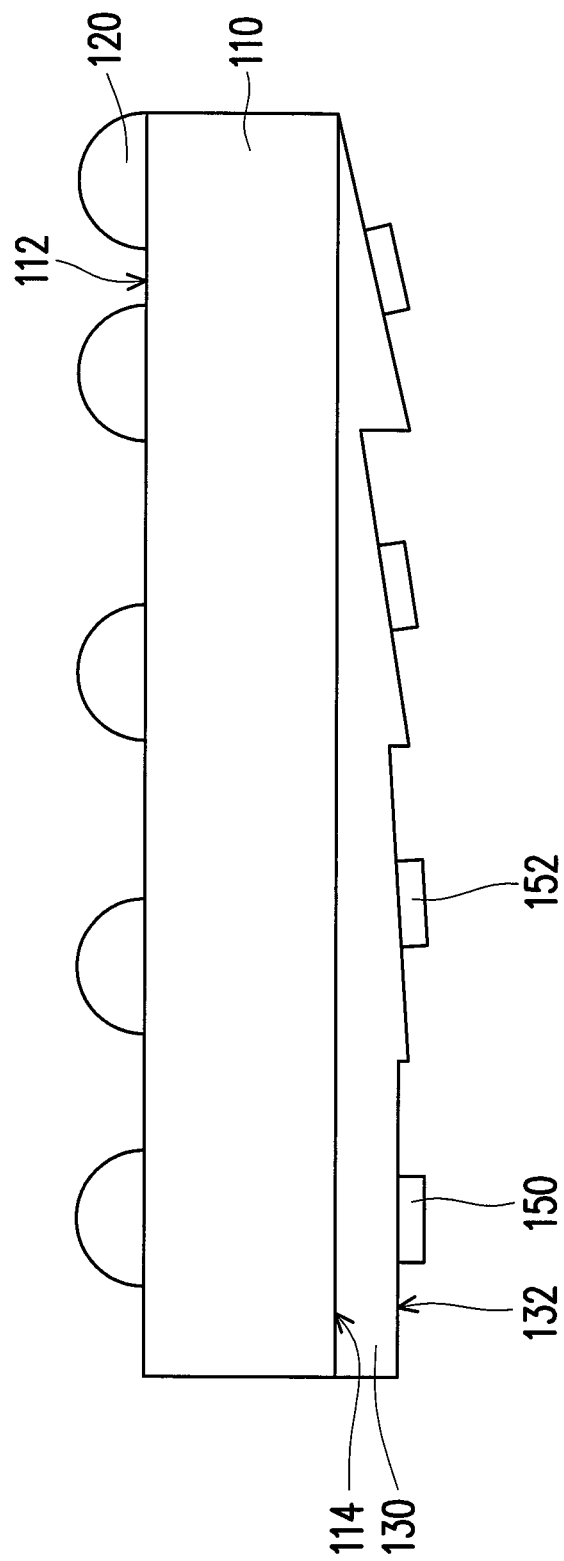

As shown in FIG. 5C and FIG. 5D, the diffusive reflection layer 150 is formed on the Fresnel lens structure, and the diffusive reflection layer 150 includes a plurality of dispersive diffusive reflection portions 152. In this embodiment, the step of forming the diffusive reflection portions 152 includes following steps. As shown in FIG. 5C, a negative photosensitive material layer 150' is formed on the Fresnel lens structure. The method of forming the negative photosensitive material layer 150' may be a dipping method, a spraying method, a jet printing method, a roller coating method, or a blade coating method. A beam 62 irradiating the negative photosensitive material layer 150' sequentially through the first surface 112 and the second surface 114 is provided. In the embodiment, the beam 62 may be provided by an exposure light source 60, and the beam 62 is an ultraviolet beam, for instance. Through the micro-lens structures 120, the portion of the negative photosensitive material layer 150' around the focus of the beam 62 is exposed, while the remaining portion of the negative photosensitive material layer 150' is not exposed. As shown in FIG. 5D, a development treatment is performed on the negative photosensitive material layer 150', so as to remove the portion of the negative photosensitive material layer 150' not irradiated by the beam (i.e., the portion of the negative photosensitive material layer 150' far from the focus of the beam 62), and non-removed portions of the negative photosensitive material layer 150' constitute the diffusive reflection portions 152. In the embodiment, the location of the exposure light source 60 relative to the micro-lens structures 120 may be close to or the same as the predetermined location of the projection apparatus 60 relative to the micro-lens structures 120.

Figure 5E:
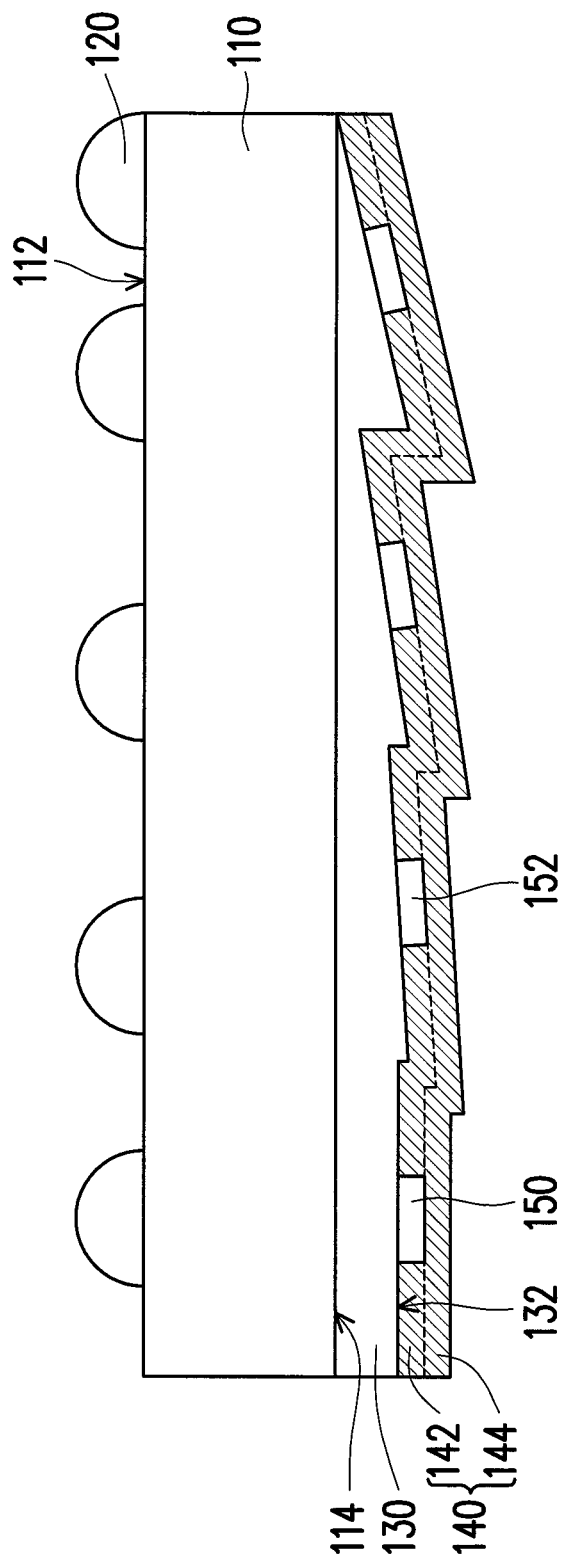

As shown in FIG. 5E, a light absorption layer 140 is formed on the Fresnel lens structure 130, and the light absorption layer 140 includes a light absorption portion 142 and a bottom portion 144. According to the embodiment, the step of forming the light absorption portion 142 includes forming the light absorption layer 140 on the Fresnel lens structure 130, wherein the light absorption layer 140 covers the diffusive reflection portions 152, and a portion of the light absorption layer 140 directly connected to the Fresnel lens structure 130 constitutes the light absorption portion 142. Therefore, the projection screen 100 depicted in FIG. 1A can be formed easily.

In the manufacturing method of the projection screen provided herein, the micro-lens structures 120 are configured to converge the beam 62 to define the locations of the diffusive reflection portions 152. Namely, the locations of the diffusive reflection portions 152 are spontaneously defined through the self alignment described above. Therefore, the diffusive reflection portions 152 can be positioned precisely with fewer errors. In addition, due to the self alignment, other time-consuming alignment processes for accurately positioning the diffusive reflection portions 152 are not required. As a result, the manufacturing method of the projection screen provided herein is easier, simpler, and the working hour is shorter.

Figure 6A:
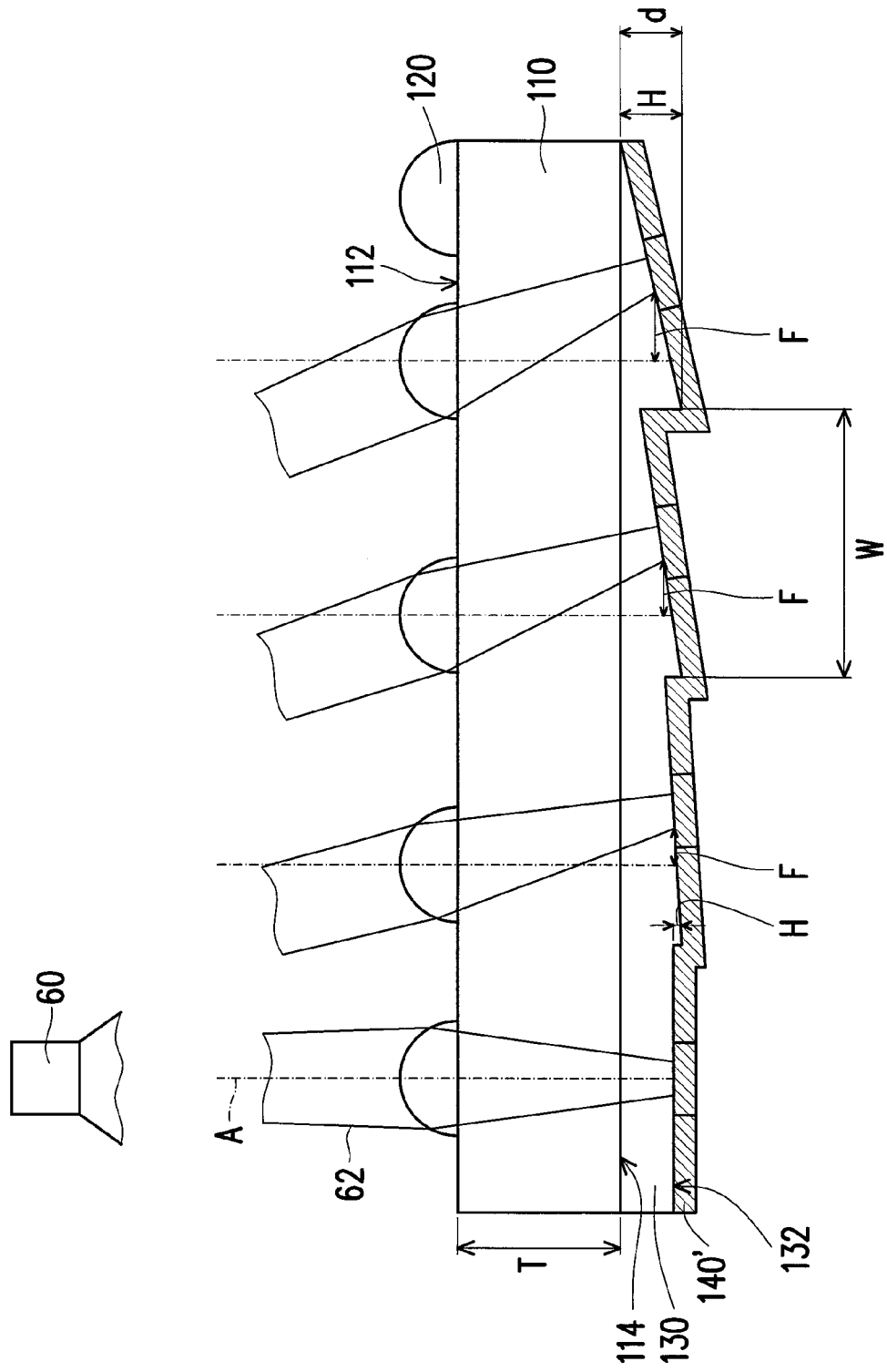
FIG. 6A to FIG. 6C are schematic cross-sectional views illustrating parts of a manufacturing process of a projection screen according to another embodiment of the invention.
Figure 6B:
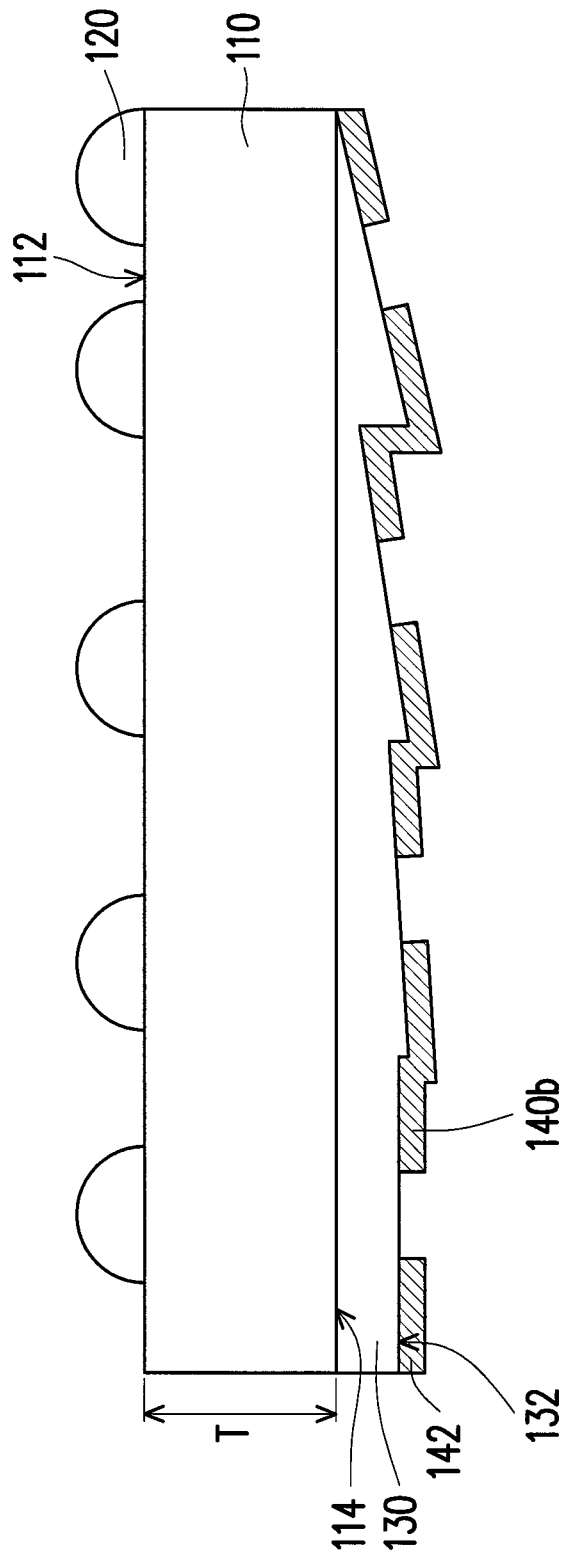
Figure 6C:
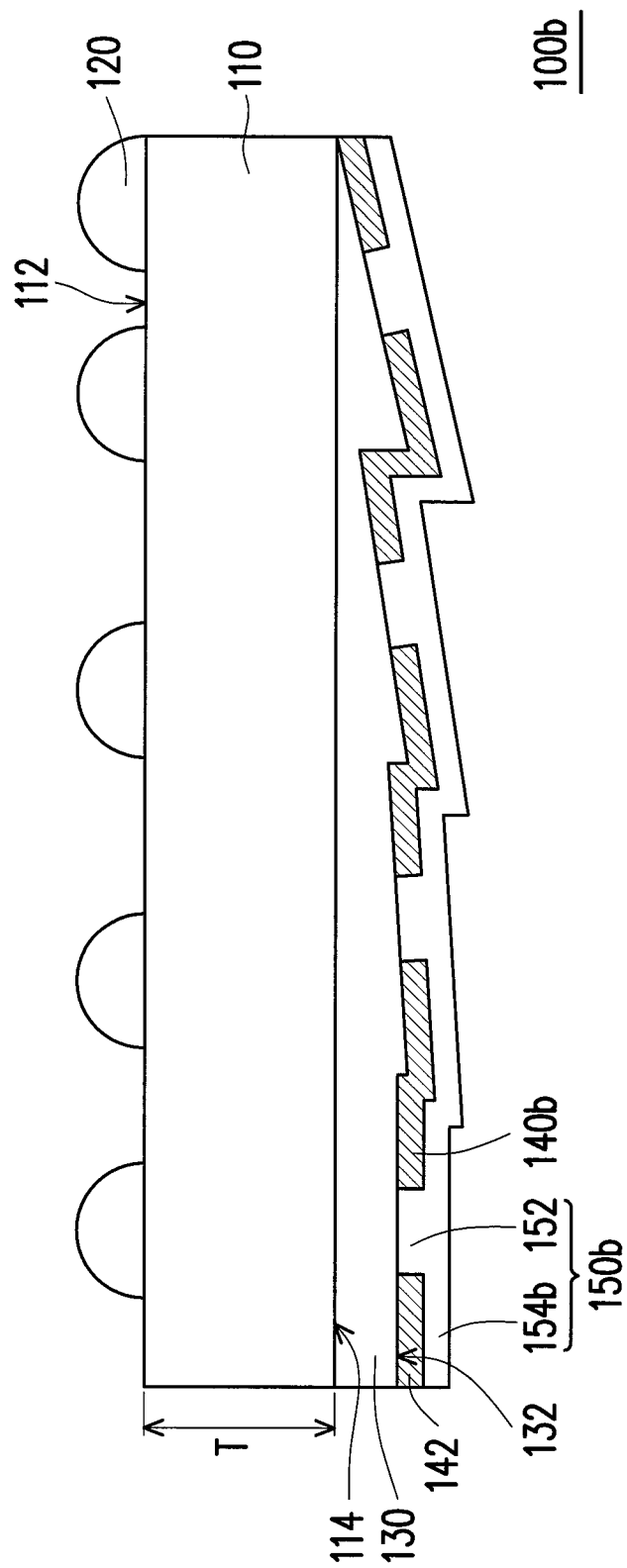

FIG. 6A to FIG. 6C are schematic cross-sectional views illustrating parts of a manufacturing process of a projection screen according to another embodiment of the invention. With reference to FIG. 6A to FIG. 6C, the manufacturing method of the projection screen described in the embodiment may be applied to manufacture the projection screen 100b depicted in FIG. 3 and is similar to that shown in FIG. 5A to FIG. 5E. In the embodiment, the manufacturing method of the projection screen first includes the steps shown in FIG. 5A to FIG. 5B, and the steps shown in FIG. 6A to FIG. 6C are then performed. The difference between these two manufacturing methods lies in the steps shown in FIG. 6A to FIG. 6C. That is, after performing the step shown in FIG. 5B, the steps shown in FIG. 6A and FIG. 6B are sequentially carried out, so as to form the light absorption layer 140b (shown in FIG. 6B) including the light absorption portion 142. In this embodiment, the step of forming the light absorption portion 142 includes following steps. As shown in FIG. 6A, the Fresnel lens structure 130 is coated with a positive photosensitive material layer 140'. A beam 62 irradiating the positive photosensitive material layer 140' sequentially through the first surface 112 and the second surface 114 is provided. Through the micro-lens structures 120, the portion of the positive photosensitive material layer 140' around the focus of the beam 62 is exposed, while the remaining portion of the positive photosensitive material layer 140 is not exposed. As shown in FIG. 6B, a development treatment is performed on the positive photosensitive material layer 140', so as to remove the portion of the positive photosensitive material layer 140' irradiated by the beam, and non-removed portions of the positive photosensitive material layer 140' constitute the light absorption portion 142.

With reference to FIG. 6C, the diffusive reflection portions 152 are formed. According to the embodiment, a method of forming the diffusive reflection portions 152 includes: forming the diffusive reflection layer 150b on the Fresnel lens structure 130, wherein the diffusive reflection layer 150b covers the light absorption portion 142, and a portion of the diffusive reflection layer 150b directly connected to the Fresnel lens structure 130 constitutes the diffusive reflection portions 152.

Figure 7:
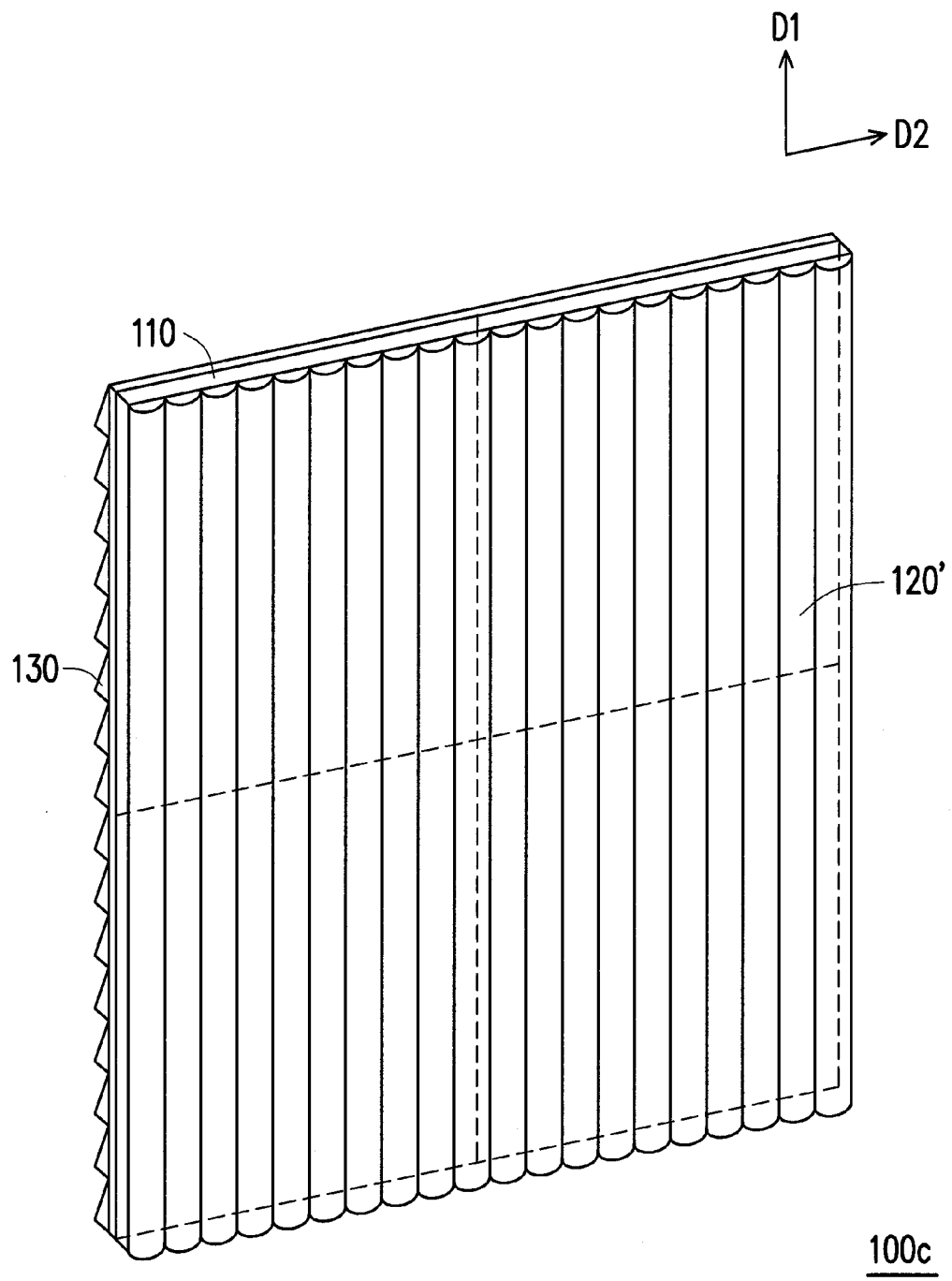
FIG. 7 is a three-dimensional view illustrating a projection screen according to another embodiment of the invention.

FIG. 7 is a three-dimensional view illustrating a projection screen according to another embodiment of the invention. Please refer to FIG. 7. The projection screen 100c provided in the embodiment is similar to those provided in the embodiments shown in FIG. 1A to FIG. 6C, while the difference therebetween lies in that the micro-lens structures 120 included in each of the projection screens 100, 100a, and 100b respectively shown in FIG. 1A to FIG. 6C are a two-dimensional micro-lens array, and that the micro-lens structures 120' of the projection screen 100c described herein are lenticular micro-lens structures (i.e. a one-dimensional lenticular micro-lens array). The lenticular micro-lens structures (the micro-lens structures 120') are extended along the direction D1 and arranged along the direction D2. In this embodiment, the direction D1 is substantially perpendicular to the direction D2. The projection screen 100c provided in the embodiment is capable of achieving the effects accomplished above, as shown in FIG. 1A to FIG. 6C.

To sum up, the projection screen and the manufacturing method thereof described in the embodiments of the invention may have at least one of the following advantages. In the projection screen provided in the invention and according to the manufacturing method of the projection screen, the deviation degrees of the diffusive reflection portions with respect to the optical axes of the corresponding micro-lens structures increase together with an increase in slopes of inclined surfaces of the Fresnel lens structure on the corresponding optical axes, and the light absorption portion is connected to the Fresnel lens structure. Therefore, the diffusive reflection portions may effectively reflect the beams from the projection apparatus to the eyes of a user in a diffusive manner, and the light absorption portion can absorb the ambient beams. The image contrast can be enhanced through the micro-lens structures, the diffusive reflection portions, and the light absorption portion of the projection screen; moreover, the beams emitted from the projection apparatus can be guided to the eyes of the user through the Fresnel lens structure, so as to increase the brightness gain.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Apparently, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. The first surface, the second surface, and similar terms mentioned in the disclosure merely serve to represent the name of individual components but not to limit the maximum or minimum number of the components.

What is claimed is:

1. A projection screen comprising:
    a transparent substrate having a first surface and a second surface opposite to the first surface;
    a plurality of micro-lens structures located at the first surface of the transparent substrate;
    a Fresnel lens structure located at the second surface of the transparent substrate;
    a light absorption layer comprising a light absorption portion connected to the Fresnel lens structure, wherein the Fresnel lens structure is located between the micro-lens structures and the light absorption layer; and
    a diffusive reflection layer comprising a plurality of dispersive diffusive reflection portions connected to the Fresnel lens structure, the diffusive reflection portions respectively corresponding to the micro-lens structures, wherein deviation degrees of the diffusive reflection portions with respect to a plurality of optical axes of the corresponding micro-lens structures increase together with an increase in slopes of inclined surfaces of the Fresnel lens structure on the corresponding optical axes.

2. The projection screen as recited in claim 1, wherein the Fresnel lens structure is a one-dimensional or two-dimensional structure.

3. The projection screen as recited in claim 1, wherein the micro-lens structures are one-dimensional lenticular microlens array or two-dimensional micro-lens array.

4. The projection screen as recited in claim 1, wherein a region of the light absorption portion directly connected to the Fresnel lens structure is other than a region of the diffusive reflection portions directly connected to the Fresnel lens structure.

5. The projection screen as recited in claim 1, wherein the micro-lens structures satisfy $T/2 \leq f \leq 10T$, f is a focal length of each of the micro-lens structures, and T is a distance from a bottom of the micro-lens structures to a bottom of the Fresnel lens structure in a direction parallel to the optical axes.

6. The projection screen as recited in claim 1, wherein the Fresnel lens structure comprises a plurality of inclined surfaces having a substantially identical width in a direction perpendicular to the optical axes but having substantially different heights in a direction parallel to the optical axes.

7. The projection screen as recited in claim 1, wherein the Fresnel lens structure comprises a plurality of inclined surfaces having a substantially identical height in a direction parallel to the optical axes but having substantially different widths in a direction perpendicular to the optical axes.

8. The projection screen as recited in claim 1, wherein the light absorption layer further comprises a bottom portion connected to the light absorption portion, the diffusive reflection portions are located between the Fresnel lens structure and the bottom portion, and the light absorption portion is located between the Fresnel lens structure and the bottom portion.

9. The projection screen as recited in claim 1, wherein the diffusive reflection layer further comprises a bottom portion connected to the diffusive reflection portions, the light absorption portion is located between the Fresnel lens structure and the bottom portion, and the diffusive reflection portions are located between the Fresnel lens structure and the bottom portion.

10. The projection screen as recited in claim 1, wherein the micro-lens structures are randomly distributed on the first surface.

11. A manufacturing method of a projection screen, comprising:
    providing a transparent substrate having a first surface and a second surface opposite to the first surface;
    forming a plurality of micro-lens structures on the first surface;
    forming a Fresnel lens structure on the second surface;
    forming a light absorption layer on the Fresnel lens structure, the light absorption layer comprising a light absorption portion, wherein the Fresnel lens structure is located between the micro-lens structures and the light absorption layer; and
    forming a diffusive reflection layer on the Fresnel lens structure, the diffusive reflection layer comprising a plurality of dispersive diffusive reflection portions respectively corresponding to the micro-lens structures, wherein deviation degrees of the diffusive reflection portions with respect to a plurality of optical axes of the corresponding micro-lens structures increase together with an increase in slopes of inclined surfaces of the Fresnel lens structure on the corresponding optical axes.

12. The manufacturing method as recited in claim 11, wherein the step of forming the diffusive reflection portions comprises:
    forming a negative photosensitive material layer on the Fresnel lens structure;
    providing a beam irradiating the negative photosensitive material layer after the beam sequentially passes through the first surface and the second surface; and
    performing a development treatment on the negative photosensitive material layer, so as to remove a portion of the negative photosensitive material layer not irradiated by the beam, wherein non-removed portions of the negative photosensitive material layer constitute the diffusive reflection portions.

13. The manufacturing method as recited in claim 12, wherein the step of forming the light absorption portion comprises:
    forming the light absorption layer on the Fresnel lens structure, the light absorption layer covering the diffusive reflection portions, wherein a portion of the light absorption layer directly connected to the Fresnel lens structure constitutes the light absorption portion.

14. The manufacturing method as recited in claim 11, wherein the step of forming the light absorption portion comprises:
    coating the Fresnel lens structure with a positive photosensitive material layer;

providing a beam irradiating the positive photosensitive material layer after the beam sequentially passes through the first surface and the second surface; and performing a development treatment on the positive photosensitive material layer, so as to remove a portion of the positive photosensitive material layer irradiated by the beam, wherein non-removed portions of the positive photosensitive material layer constitute the light absorption portion.

15. The manufacturing method as recited in claim 14, wherein the step of forming the diffusive reflection portions comprises:

forming the diffusive reflection layer on the Fresnel lens structure, the diffusive reflection layer covering the light absorption portion, wherein a portion of the diffusive reflection layer directly connected to the Fresnel lens structure constitutes the diffusive reflection portions.

16. The manufacturing method as recited in claim 11, wherein the step of forming the micro-lens structures on the first surface comprises forming the micro-lens structures on the first surface, and the micro-lens structures are randomly distributed on the first surface.

17. The manufacturing method as recited in claim 11, wherein the Fresnel lens structure is a one-dimensional or two-dimensional structure.

18. The manufacturing method as recited in claim 11, wherein the micro-lens structures are a one-dimensional lenticular array or a two-dimensional micro-lens array.

19. The manufacturing method as recited in claim 11, wherein the micro-lens structures satisfy $T/2 \le f \le 10T$, f is a focal length of each of the micro-lens structures, and T is a distance from a bottom of the micro-lens structures to a bottom of the Fresnel lens structure in a direction parallel to the optical axes.

20. The manufacturing method as recited in claim 11, wherein the step of forming at least one of the light absorption portion and each of the diffusive reflection portions comprises forming a material on the Fresnel lens structure by performing a dipping step, a spraying step, a jet printing step, a roller coating step, or a blade coating step.

21. The manufacturing method as recited in claim 11, wherein the step of forming at least one of the Fresnel lens structure and each of the micro-lens structures comprises performing a hot embossing step or an ultraviolet transfer printing step.

* * * * *